(12) United States Patent
Viola

(10) Patent No.: US 7,098,658 B2
(45) Date of Patent: Aug. 29, 2006

(54) DIGITAL SIGNAL CONDITIONING SOLUTION FOR A MAGNETOMETER CIRCUIT

(75) Inventor: Jeffrey L. Viola, Berkley, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 232 days.

(21) Appl. No.: 10/816,423

(22) Filed: Apr. 1, 2004

(65) Prior Publication Data

US 2005/0218891 A1    Oct. 6, 2005

(51) Int. Cl.
 G01R 33/04    (2006.01)
 G01B 7/24    (2006.01)
 G01L 3/10    (2006.01)

(52) U.S. Cl. .................. 324/254; 324/253; 324/209; 73/862.333

(58) Field of Classification Search .............. 324/244, 324/209, 253, 254, 228, 234, 239; 73/862.333
See application file for complete search history.

(56) References Cited

U.S. PATENT DOCUMENTS

| | | |
|---|---|---|
| 3,971,981 A | 7/1976 | Nakagome et al. |
| 3,983,475 A | 9/1976 | Watanabe et al. |
| 4,100,492 A | 7/1978 | Forster |
| 4,112,754 A | 9/1978 | Suminsby |
| 4,112,755 A | 9/1978 | Sullivan |
| 4,114,436 A | 9/1978 | Suminsby |
| 4,116,057 A | 9/1978 | Sullivan |
| 4,424,631 A | 1/1984 | Franks |
| 4,425,717 A | 1/1984 | Marcus |
| 4,475,078 A | 10/1984 | Itani |
| 4,505,054 A | 3/1985 | Clark et al. |
| 4,677,381 A | 6/1987 | Geerlings |
| 4,717,873 A | 1/1988 | Carr, Jr. et al. |
| 4,750,349 A | 6/1988 | Luitje |
| 4,972,728 A * | 11/1990 | Yoshimura et al. ..... 73/862.333 |
| 4,977,374 A | 12/1990 | Kleiner |
| 5,254,987 A * | 10/1993 | Nakatani .................... 340/988 |
| 5,442,966 A * | 8/1995 | Hase et al. ............ 73/862.335 |
| 5,652,512 A * | 7/1997 | Feintuch et al. ............ 324/254 |
| 5,672,967 A | 9/1997 | Jensen et al. |

(Continued)

OTHER PUBLICATIONS

Primdahl et al., Digitial Detection of the Flux-Gate Sensor Output Signal, Meas. Sci. Technol. vol. 5 (1994), pp. 359-362.*

(Continued)

Primary Examiner—Edward Lefkowitz
Assistant Examiner—Kenneth J. Whittington
(74) Attorney, Agent, or Firm—Brinks Hofer Gilson & Lione

(57) ABSTRACT

A fluxgate magnetometer including a fluxgate and a digital processor. The digital processor includes an analog to digital converter for digitizing the back EMF from the fluxgate and a signal generator to generate the fluxgate driving signal. Further, a current sourcing circuit is provided to receive the fluxgate driving signal from the signal generator and transmit a current amplified driver signal to the fluxgate capable of driving the fluxgate in and out of saturation. The signal generator is a pulse width modulator used in conjunction with a voltage shaper and driver to create a triangle-shaped driving signal to excite the fluxgate. The digital processor is further configured to reverse the sign of the digital back EMF signal at a frequency corresponding to two times the frequency of the fluxgate driving signal thereby capturing only the second harmonic of the back EMF signal.

24 Claims, 2 Drawing Sheets

U.S. PATENT DOCUMENTS

| | | | | |
|---|---|---|---|---|
| 6,341,534 B1 * | 1/2002 | Dombrowski | .......... | 73/862.333 |
| 6,467,360 B1 * | 10/2002 | Bogdanov | .............. | 73/862.333 |
| 6,581,480 B1 * | 6/2003 | May et al. | ............. | 73/862.333 |
| 6,633,160 B1 * | 10/2003 | How et al. | ................... | 324/253 |
| 6,653,831 B1 * | 11/2003 | Friend et al. | ................ | 324/244 |
| 6,698,299 B1 * | 3/2004 | Cripe | .................... | 73/862.331 |
| 6,871,553 B1 * | 3/2005 | Naidu et al. | ........... | 73/862.331 |
| 2002/0008523 A1 * | 1/2002 | Klang | ........................ | 324/429 |

OTHER PUBLICATIONS

Cruz et al., New Kind of Fluxgate Magnetometer Probe With Enhanced Electronic Processing, IEEE explore (1998).*

Piil-Henriksen et al., Digital Detection and Feedback Fluxgate Magnetometer, Meas. Sci. Technol. vol. 7 (1996), pp. 897-903.*

Pedersen et al., Digital Fluxgate Magnetometer for the Astrid-2 Satellite, Meas. Sci. Technol. vol. 10 (1999), pp. N124-n129.*

* cited by examiner

DIGITAL SIGNAL CONDITIONING SOLUTION FOR A MAGNETOMETER CIRCUIT

BACKGROUND

The present invention generally relates to the signal conditioning of magnetometer circuits and more specifically to a sensing system utilizing a fluxgate magnetometer and a digital processor.

Fluxgate magnetometers are well known devices and have been used in the implementation of magnetoelastic torque transducers. Such transducers are used in many applications, including without limitation, transmission control driveline measurement, electronic power assisted steering inputs, etc.

Traditionally the back electromagnetic field (EMF) from fluxgate magnetometers has been processed in the analog domain. This requires many discrete analog devices incorporated into a large circuit, or alternatively, very expensive analog application specific integrated circuit (ASIC) chips.

In view of the above, it is apparent that there exists a need for an improved signal conditioning solutions for conditioning signals from fluxgate magnetometers.

SUMMARY

In satisfying the above need, as well as overcoming the enumerated drawbacks and other limitations of the related art, one implementation of the present invention provides a fluxgate magnetometer including a fluxgate and a digital processor. The digital processor includes an analog to digital converter for digitizing the back EMF from the fluxgate and a signal generator to generate the fluxgate driving signal. Further, a current sourcing circuit is provided to receive the fluxgate driving signal from the signal generator and transmit to the fluxgate a current amplified driver signal capable of driving the fluxgate in and out of saturation. The signal generator may be a pulse width modulator or multiple pulse width modulators used in conjunction with a voltage shaper and driver to create a triangle shaped current signal to excite the fluxgate.

In another aspect of the present invention, the digital processor is configured to reverse the sign of the back EMF signal at a frequency corresponding to two times the frequency of the fluxgate driving signal, thereby capturing only the second harmonic of the back EMF signal. Next, the digital processor integrates the back EMF signal to generate a signal corresponding to the physical input of the fluxgate magnetometer. The result of the integration is used to re-null the fluxgate. A detection algorithm is provided within the digital processor to detect a saturation condition of the integrator and provide a reset in such cases. It may also be converted to an analog output signal to promote compatibility with other types of sensors.

Further objects, features and advantages of this invention will become readily apparent to persons skilled in the art after a review of the following description, with reference to the drawings and claims that are appended to and form a part of this specification.

DETAILED DESCRIPTION

Figure 1:
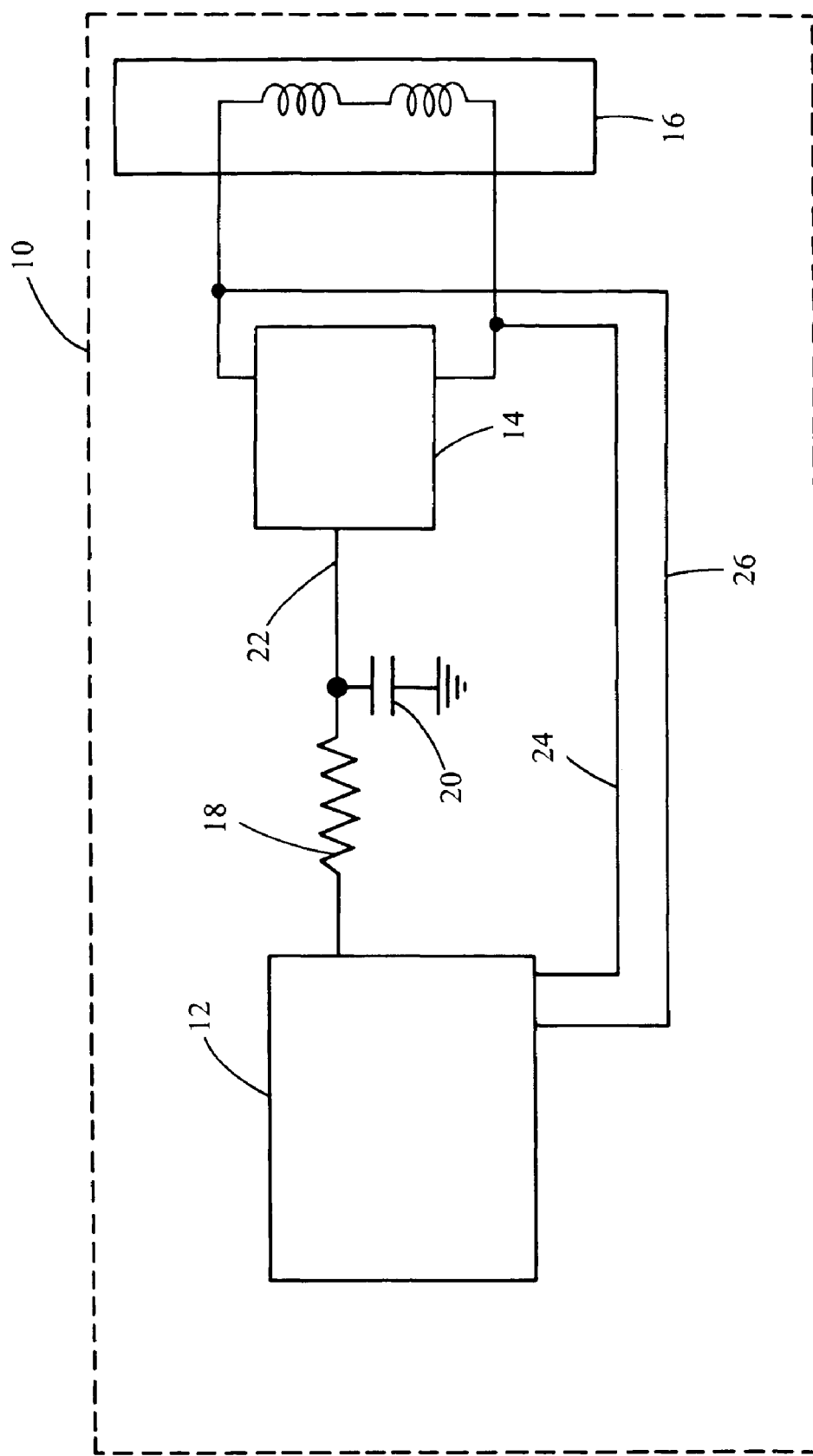
FIG. 1 is a sensing system using a fluxgate magnetometer and a voltage shaper and a, digital processor.

Now referring to FIG. 1, a system embodying the principles of the present invention is illustrated therein and designated at 10. The system 10 includes a digital processor 12, a current sourcing circuit 14, and a fluxgate 16.

The digital processor 12 creates a fluxgate-driving signal 22 configured to excite the fluxgate 16. The fluxgate driving signal 22 is filtered by a resistor-capacitor combination formed by resistor 18 and capacitor 20. The fluxgate driving signal 22 is preferably a triangle wave current signal. However, often it is easier for a digital processor to generate a square wave voltage signal that can be manipulated using a current sourcing circuit 14 to generate a triangle current waveform that excites the fluxgates 16. The current sourcing circuit 14 transmits a current amplified fluxgate driver signal to drive the fluxgate 16 in and out of saturation. The digital processor 12 is connected to the fluxgate 16 along lines 24 and 26 to measure the back EMF across the fluxgate 16.

In the example of an magnetoelastic torque transducer, or torque sensor, the back EMF of the fluxgate 16 will vary with respect to the amount of torque introduced to the sensor. The digital processor 12 receives the back EMF along lines 24 and 26 and creates a digital back EMF signal representing the back EMF measurement. The processor 12 is configured to change the polarity of the digital back EMF signal at a frequency twice that of the driving signal 22. By switching the polarity of the data at twice the frequency of the driving signal 22, only the second harmonic component of the back EMF is captured. The digital back EMF signal is then integrated in the processor 12 creating a summation signal. The summation signal may be used by the processor 12 to vary the modulation of the driving signal 22 acting as a null circuit to the fluxgate 16. In the example of the torque sensor, the summation signal is representative of the torque applied to the sensor.

Figure 2:
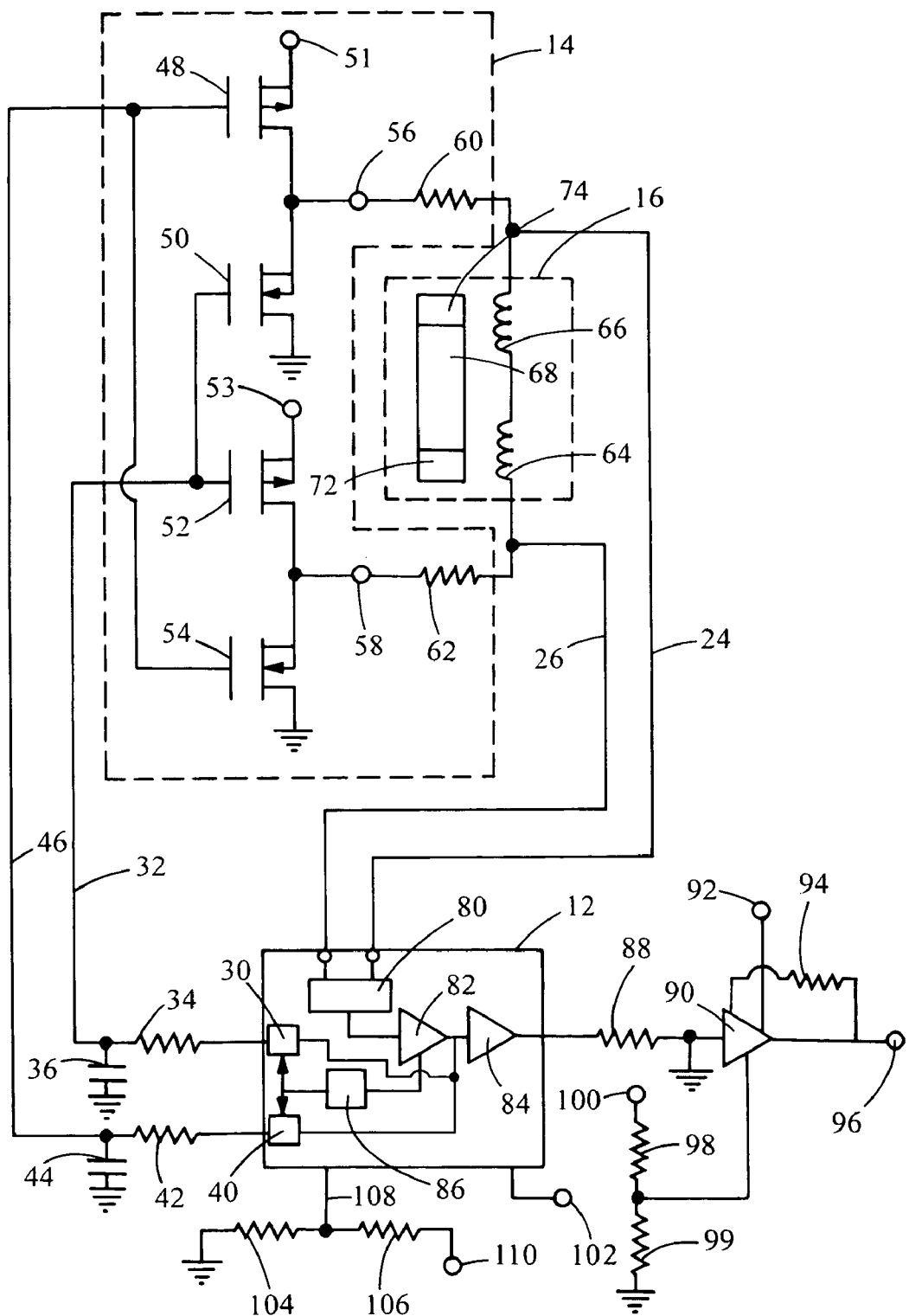
FIG. 2 is a schematic of a sensing system utilizing a fluxgate and a digital processor according to the present invention.

Now referring to FIG. 2, another embodiment of the present invention is shown in detail. The digital processor 12 includes a pulse width modulator 30 for generating the fluxgate drive signal 32. Pulse width modulators are readily available on digital processors and can operate at high or low frequencies. The pulse width modulator 30 works in conjunction with the resistor 34 and capacitor 36 to create a conditioned voltage signal. The preferred conditioned voltage signal may, alternatively, be generated by a digital to analog converter or other signal generator. The driver fluxgate signal 32 is received by the current sourcing circuit 14. Further, as shown in FIG. 2, a second pulse width modulator 40, which is the inverse of the first pulse width modulator, is utilized for driving the fluxgate 16 in and out of saturation. The pulse width modulator 40 works in combination with resistor 42 and capacitor 44 to generate a fluxgate driver signal 46 in the form of a conditioned voltage signal that is received by the current sourcing circuit 14.

The current sourcing circuit 14 amplifies the current available for saturating the fluxgate 16. The current sourcing circuit 14 allows a low voltage, low current digital processor to be used to generate the driving signals 32 and 46, while still providing enough current to drive the fluxgate 16 in and out of saturation. In addition, the current sourcing circuit 14 is configured to selectively connect the first pulse width modulator 30 with one side of the fluxgate 16 while simultaneously connecting the second pulse width modulator 40 to the other side of the fluxgate 16. To accomplish this task, the current sourcing circuit 14 includes four MOSFET transistors 48, 50, 52, and 54. Transistors 48 and 50 are P and N-channel MOSFETs respectively and are in communication with the first pulse width modulator 30. Transistor 52 and transistor 54 are P and N-channel MOSFETs respectively and are in communication with the second pulse width modulator 40. The first pulse width modulator 30 is in electrical communication with the gate of transistor 48 and the gate of transistor 50. The second pulse width modulator 40 is in electrical communication with the gate of transistor 52 and the gate of transistor 54. The drain of transistor 52 is in electrical connection with a power source 53 and the source of transistor 52 is in communication with the fluxgate 16, such that, as the conditioned voltage increases, transistor 52 increases the current provided to the fluxgate 16 to saturate the fluxgate 16. The source of transistor 50 is connected to ground such that as transistor 52 provides current through the fluxgate 16, transistor 50 provides a path through the fluxgate 16 to ground.

Similarly, the drain of transistor 48 is in electrical connection with a power source 51 and the source of transistor 48 is in communication with the fluxgate 16, such that, as the conditioned voltage increases, transistor 48 increases the current provided to the fluxgate 16 to saturate the fluxgate 16. The source of transistor 50 is connected to ground such that as transistor 48 provides current through the fluxgate 16, and transistor 50 provides a path through the fluxgate 16 to ground.

Further, a choke may be provided between the transistors and the fluxgate 16 as indicated by reference number 58 and 56 to slow down the rate of change of current entering the fluxgate 16. A choke is a magnetic ring located around a wire and configured to diffuse the rate of current flow. Resistor 62 and 60 are also provided on each end of the fluxgate 16 to set the range of current flow generated through the fluxgate 16.

The fluxgate 16 includes a first coil 66 and a second coil 64, although, a single coil may be used. The fluxgate 16 also includes a magnetic rod 68 located proximate to the first and second coils 66 and 64. As torque is applied to the magnetic rod 68, zones 72 and 74 change their level of flux density proportional to the applied load. This flux density creates a back EMF that can be measured along lines 26 and 24.

The digital processor 12 is connected to the fluxgate 16 and receives the back EMF signal along lines 26 and 24. The digital processor 12 includes an analog to digital converter 80 that is configured to receive digitize the signals at lines 24 and 26. The digital processor 12 subtracts these values thus creating a digital back EMF signal. The sign of the digital back EMF signal is changed at a frequency that is twice the frequency of the driving signal thereby capturing the second harmonic component of the back EMF signal. As indicated by block 82, the differential data set is continuously integrated to generate a summation signal. One method for calculating the summation signal includes using a Riemann sum calculation. The summation signal is representative of the magnitude of torque applied to the magnetic shaft 68. As indicated by box block 86, the integrated data set is processed and used to adjust the modulation of the pulse width modulators 30 and 40 thereby closing the feedback loop and offsetting the drive current to renull back EMF generated across the fluxgate 16.

In addition, the digital processor 12 includes a digital to analog output 84 allowing the torque sensor to generate an analog output providing compatibility with many commonly available sensors. Alternatively, digital communication schemes such as serial, CAN, PWM, 4–20 mA, may be used as an output. Most digital processors run off of low current, low voltage sources such as a voltage input as indicated by reference numeral 102. Further, a reference voltage 108 can be defined for the signal generators 30 and 40 utilizing a voltage divider as indicated by resistors 104 and 108 in connection with voltage source 110.

To further provide compatibility with common sensors, a voltage amplifier may be provided in a stand-alone implementation. As shown, the voltage amplifier includes resistor 88 connected to the digital processor 12 and operational amplifier 90. Further, feedback resistor 94 is connected between the input and output of the operational amplifier 90. An input voltage typically five volts, is provided as indicated by reference numeral 92 to the operational amplifier 90. Further, the output range can be scaled by utilizing the voltage divider, shown as resistor 98 and resistor 99 in conjunction with the voltage supply 100 to produce an offset voltage adjustment to the operational amplifier 90.

As a person skilled in the art will readily appreciate, the above description is meant as an illustration of implementation of the principles of this invention. This description is not intended to limit the scope or application of this invention in that the invention is susceptible to modification, variation and change, without departing from spirit of this invention, as defined in the following claims.

I claim:

1. A fluxgate magnetometer comprising:
   a fluxgate;
   a digital processor in communication with the fluxgate, the digital processor including an analog to digital converter configured to digitize a back EMF signal from the fluxgate generating digitized back EMF signal, and a first signal generator configured to generate a fluxgate driving signal, wherein the digital processor is configured to reverse the sign of the digitized back EMF signal at a frequency corresponding to two times the frequency of the fluxgate drive signal.

2. The system according to claim 1 wherein the first signal generator is a pulse width modulator.

3. The system according to claim 1 wherein the analog to digital converter is connected to a first coil output and a second coil output of the fluxgate.

4. The system according to claim 1, wherein the digital processor is configured to integrate the digitized back EMF signal thereby generating a summation signal.

5. The system according to claim 4, wherein the digital processor is configured to integrate the digitized back EMF signal using a Reimann Sum calculation.

6. The system according to claim 4 wherein the digital processor is configured to modulate the fluxgate driving signal generated by the signal generator based on the summation signal.

7. The system according to claim 4 wherein the digital processor includes a digital to analog converter configured to convert the summation signal into an analog output signal.

8. The system according to claim 7, wherein the digital to analog converter is in electrical communication with a signal amplifier configured to generate an amplified analog output signal.

9. A fluxgate magnetometer comprising:
   a fluxgate;
   a digital processor in communication with the fluxgate, the digital processor including an analog to digital converter configured to digitize a back EMF signal from the fluxgate generating digitized back EMF signal, and a first signal generator configured to generate a fluxgate driving signal;
   a current sourcing circuit configured to receive the fluxgate driving signal from the first signal generator of the digital processor, and transmit a current amplified driver signal to the fluxgate;

a resistor connected in electrical series between the first signal generator and the current sourcing circuit, and a capacitor is in electrically parallel connection between the resistor and an electrical ground; and a second signal generator in electrical communication with the current sourcing circuit, wherein the current sourcing circuit includes a first, second, third, and fourth transistor, the first, second, third, and fourth transistor in electrical communication with the fluxgate.

10. The system according to claim 9, wherein the first, second, third, and fourth transistors are MOSFET transistors.

11. The system according to claim 10 wherein the second and third transistor is in electrical communication with the first signal generator, and the first and fourth transistors are in electrical communication with the second signal generator.

12. The system according to claim 11, wherein the second and third transistors are N-channel MOSFETs, and wherein the first and fourth transistors are P-channel MOSFETs.

13. A sensor for measuring torque comprising:

a fluxgate including a magnetic shaft mounted such that a torque may be applied causing a rotation of the shaft, such that a rotation of the shaft creates a back EMF in a coil;

a digital processor in communication with the fluxgate, the digital processor including an analog to digital converter configured to digitize the back EMF signal from the fluxgate generating a digitized back EMF signal, and a first signal generator configured to generate a fluxgate driving signal, wherein the digital processor is configured to reverse the sign of the digitized back EMF signal at a frequency corresponding to two times the frequency of the fluxgate drive signal.

14. The system according to claim 13 wherein the first signal generator is a pulse width modulator.

15. The system according to claim 13 wherein the analog to digital converter is connected to a first coil output and a second coil output of the fluxgate.

16. The system according to claim 13, wherein the digital processor is configured to integrate the digitized back EMF signal thereby generating a summation signal.

17. The system according to claim 16, wherein the digital processor is configured to integrate the digitized back EMF signal using a Reimann Sum calculation.

18. The system according to claim 16 wherein the digital processor is configured to modulate the fluxgate driving signal generated by the signal generator based on the summation signal.

19. The system according to claim 16, wherein the digital processor includes a digital to analog converter configured to convert the summation signal into an analog output signal.

20. The system according to claim 19 wherein the digital to analog converter is in electrical communication with a signal amplifier configured to generate an amplified analog output signal.

21. A sensor for measuring torque comprising:

a fluxgate including a magnetic shaft mounted such that a torque may be applied causing a rotation of the shaft, such that a rotation of the shaft creates a back EMF in a coil;

a digital processor in communication with the fluxgate, the digital processor including an analog to digital converter configured to digitize the back EMF signal from the fluxgate generating a digitized back EMF signal, and a first signal generator configured to generate a fluxgate driving signal;

a current sourcing circuit configured to receive the fluxgate driving signal from the first signal generator of the digital processor, and transmit a current amplified driver signal to the fluxgate;

a resistor is connected in electrical series between the first signal generator and the current sourcing circuit, and a capacitor is in electrically parallel connection between the resistor and an electrical ground; and further comprising a second signal generator in electrical communication with the current sourcing circuit, wherein the current sourcing circuit includes a first, second, third, and fourth transistor, the first, second, third, and fourth transistor in electrical communication with the fluxgate.

22. The system according to claim 21, wherein the first, second, third, and fourth transistors are MOSFET transistors.

23. The system according to claim 22 wherein the second and third transistor is in electrical communication with the first signal generator, and the first and fourth transistors are in electrical communication with the second signal generator.

24. The system according to claim 23 wherein the second and third transistors are N-channel MOSFETs, and wherein the first and fourth transistors are P-channel MOSFETs.

* * * * *

UNITED STATES PATENT AND TRADEMARK OFFICE
CERTIFICATE OF CORRECTION

PATENT NO. : 7,098,658 B2
APPLICATION NO. : 10/816423
DATED : August 29, 2006
INVENTOR(S) : Jeffrey L. Viola It is certified that error appears in the above-identified patent and that said Letters Patent is hereby corrected as shown below:

Column 4, in claim 2, line 1, after "claim 1" insert --,-- (comma).

Column 4, in claim 3, line 1, after "claim 1" insert --,-- (comma).

Column 4, in claim 6, line 1, after "claim 4" insert --,-- (comma).

Column 4, in claim 7, line 1, after "claim 4" insert --,-- (comma).

Column 5, in claim 14, line 1, after "claim 13" insert --,-- (comma).

Column 5, in claim 15, line 1, after "claim 13" insert --,-- (comma).

Column 6, in claim 18, line 1, after "claim 16" insert --,-- (comma).

Column 6, in claim 20, line 1, after "claim 19" insert --,-- (comma).

Column 6, in claim 23, line 1, after "claim 22" insert --,-- (comma).

Column 6, in claim 24, line 1, after "claim 23" insert --,-- (comma).

Signed and Sealed this

Twenty-sixth Day of December, 2006

JON W. DUDAS
*Director of the United States Patent and Trademark Office*